ized Patent

(12) United States Patent
Tanase et al.

(10) Patent No.: US 9,090,796 B2
(45) Date of Patent: Jul. 28, 2015

(54) ORGANIC-INORGANIC COMPOSITE MATERIALS CONTAINING TRIAZINE RINGS AND ELECTRICAL DEVICES USING THE SAME

(71) Applicant: Hitachi, Ltd., Tokyo (JP)

(72) Inventors: Tomokazu Tanase, Hitachinaka (JP); Hiroyuki Kagawa, Hitachiaka (JP); Satoru Amou, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 39 days.

(21) Appl. No.: 13/671,614

(22) Filed: Nov. 8, 2012

(65) Prior Publication Data

US 2013/0131248 A1    May 23, 2013

(30) Foreign Application Priority Data

Nov. 22, 2011  (JP) .................................. 2011254926
Jun. 15, 2012  (JP) .................................. 2012135584

(51) Int. Cl.
   *C08G 73/06*   (2006.01)
   *C08L 79/04*   (2006.01)
   (Continued)

(52) U.S. Cl.
   CPC .......... *C09D 167/00* (2013.01); *C08G 73/0644* (2013.01); *C08G 73/0655* (2013.01); *C08G 73/0661* (2013.01); *C08K 3/346* (2013.01);
   (Continued)

(58) Field of Classification Search
   CPC .............. C08G 73/064; C08G 73/0644; C08G 73/065; C08G 73/0655; C08G 73/0661; C08K 5/17; C08K 9/04; C08K 9/06; C08K 3/346; C08L 79/04; C09D 179/04; H01B 3/303

USPC ................................................... 524/445, 449
See application file for complete search history.

(56) References Cited

U.S. PATENT DOCUMENTS 3,694,408 A  *  9/1972  Hynds et al. .................. 528/210
3,694,410 A  *  9/1972  Oehmke ....................... 528/323
(Continued)

FOREIGN PATENT DOCUMENTS

DE        1190184        * 12/1965
EP     1 229 079 A1       8/2002
(Continued)

OTHER PUBLICATIONS

Machine translated English equivalent of JP 2005-015611 (Jan. 2005, 28 pages).*

(Continued)

*Primary Examiner* — Brieann R Fink
(74) *Attorney, Agent, or Firm* — Volpe and Koenig, P.C.

(57) ABSTRACT

The present invention provides an organic-inorganic composite material having excellent thermal stability, electrical insulation and adhesiveness. The organic-inorganic composite material includes a resin composed of a triazine ring and obtained by thermally curing a varnish containing a mixture of a layered clay mineral (clay) subjected to interlayer modification with a curing catalyst for a cyanate ester compound and a cyanate ester compound, wherein the amount of the clay is from 0.1 to 12 wt % of the amount of the cyanate ester compound. The invention also provides a varnish which gives the organic-inorganic composite material, and an electrical device and a semiconductor device, each of which includes the organic-inorganic composite material.

14 Claims, 8 Drawing Sheets

(51) Int. Cl.

| | | |
|---|---|---|
| *C09D 167/00* | (2006.01) | |
| *C08K 5/17* | (2006.01) | |
| *C08K 3/34* | (2006.01) | |
| *C09D 7/12* | (2006.01) | |
| *C09D 179/04* | (2006.01) | |
| *C08K 9/04* | (2006.01) | |
| *B82Y 30/00* | (2011.01) | |
| *H01B 3/30* | (2006.01) | |
| *C08K 5/00* | (2006.01) | |

(52) U.S. Cl.
CPC ... *C08K 5/17* (2013.01); *C08K 9/04* (2013.01); *C08L 79/04* (2013.01); *C09D 7/1225* (2013.01); *C09D 7/1291* (2013.01); *C09D 179/04* (2013.01); *B82Y 30/00* (2013.01); *C08K 5/0091* (2013.01); *H01B 3/303* (2013.01); *H01L 2224/32245* (2013.01); *H01L 2224/48091* (2013.01); *H01L 2224/48247* (2013.01); *H01L 2224/73265* (2013.01)

(56) References Cited

U.S. PATENT DOCUMENTS

| | | | | |
|---|---|---|---|---|
| 4,607,094 | A * | 8/1986 | Sugawara et al. | 528/323 |
| 5,468,790 | A * | 11/1995 | Papathomas | 524/100 |
| 6,562,891 | B1 * | 5/2003 | Tsai et al. | 524/445 |
| 2004/0254329 | A1 * | 12/2004 | Daum et al. | 528/119 |

FOREIGN PATENT DOCUMENTS

| | | |
|---|---|---|
| JP | 2004-123987 A | 4/2004 |
| JP | 2005-015611 A | 1/2005 |
| JP | 2005251543 A | 9/2005 |
| JP | 2006265507 A | 10/2006 |

OTHER PUBLICATIONS

Machine translated English equivalent of JP 2004-123987 (Apr. 2004, 38 pages).*

Machine translated English equivalent of DE 1190184 (Dec. 1965, 7 pages).*

Wooster (Cyanate ester polymerization catalysis by layered silicates. Polymer. 45, 2004, pp. 7845-7852).*

Burba (The Orientation and Interaction of Ethylenediamine Copper (II) with Montmorillonite. Clays and Clay Minerals. 25, 1977. pp. 113-118).*

"Database WPI, Week 200440", Thomson Scientific, London, GB, AN 2004-423396, XP002693736.

"Database WPI, Week 200515", Thomson Scientific, London, GB, AN 2005-134783, XP002693737.

"Effect of Bentonite Modified with Novel Phosphonium on the Physical Properties of Acid Anhydride-Cured Epoxy Resin/Clay Nanocomposites," Journal of Network Polymer, vol. 30, No. 2, pp. 69-76, (2009).

"Development of Clay Minerals/Organic Polymer Nano-hybrid Materials," The Journal of the Chemical Society of Japan, No. 9, pp. 605-611, (2000).

* cited by examiner

ORGANIC-INORGANIC COMPOSITE MATERIALS CONTAINING TRIAZINE RINGS AND ELECTRICAL DEVICES USING THE SAME

BACKGROUND OF THE INVENTION

1. Field of the Invention

The present invention relates to: an organic-inorganic composite material containing a triazine ring, which is a cured material of a cyanate ester compound and has excellent electrical insulation, thermal stability and adhesiveness to a metal material; an electrical device using the organic-inorganic composite material; a semiconductor device using the organic-inorganic composite material; and a varnish which gives the cured material.

2. Background Art

The power densities of electrical and electronic devices are increasing yearly, and in the operating environment of inverters and power generators, the temperature is increased and the intensity of the electrical field is also increased. Accompanying this, there is a demand that an insulating resin material constituting such a device should have high thermal stability, high voltage resistance, and high adhesive strength to a heterogeneous member such as a metal.

It is known that a layered clay mineral (clay) typified by montmorillonite or smectite has excellent electrical insulation and can impart excellent properties such as impartment of flame retardancy, reduction in dielectric constant, improvement of insulation life, increase in mechanical strength and reduction in thermal expansion by combining any of various resin materials such as polyolefins, nylons, polystyrenes and epoxy resins. In order to allow a material to exhibit these excellent properties, it is necessary to form a composite of a clay and a resin, and in order to form such a composite, it is necessary to select a clay which is appropriately subjected to interlayer modification depending on the type of resin to be combined.

For example, Patent Document 1 (JP-A-2006-265507) discloses the impartment of flame retardancy by forming a composite of a polyolefin and a clay organified with ammonium ions, Patent Document 2 (JP-A-2005-251543) discloses the improvement of insulation life of an epoxy resin by a clay subjected to interlayer modification with quaternary ammonium ions, Non-Patent Document 1 ("Effect of Bentonite Modified with Novel Phosphonium on the Physical Properties of Acid Anhydride-Cured Epoxy Resin/Clay Nanocomposites", Journal of Network Polymer, (2009) Vol. 30, No. 2, pp. 69-76) discloses a reduction in thermal expansion of an epoxy resin by montmorillonite subjected to interlayer modification with phosphonium ions, and Non-Patent Document 2 ("Development of Clay Minerals/Organic Polymer Nanohybrid Materials", The Journal of The Chemical Society of Japan, (2000), No. 9, pp. 605-611) discloses an increase in strength of a nylon by montmorillonite subjected to interlayer modification with 1,2-aminolauric acid.

However, although a clay dispersion technique employing a conventional interlayer modification method is effective in thermoplastic resins or some thermosetting resins, the technique cannot be applied to cyanate ester cured resins having high thermal stability. The invention is directed to a material, which could be also called a support for uniformly mixing and dispersing clay in a cyanate ester cured resin having high thermal stability and a curing catalyst for the compound. Further, a clay to be used in the material can serve not only as a catalyst, but also as an inorganic filler for a cured material containing a triazine ring, and gives high electrical insulation, high thermal stability (a glass transition temperature of 200° C. or higher), high adhesiveness to a metal and high mechanical strength to a composite material.

SUMMARY OF THE INVENTION

Accordingly, an object of the invention is to provide: an organic-inorganic composite material, which has a glass transition temperature of 200° C. or higher, high adhesiveness to a metal material and a high electrical breakdown voltage; an electrical device using the organic-inorganic composite material; and a varnish to be used for forming the organic-inorganic composite material.

The invention provides an organic-inorganic composite material, including a resin composed of a triazine ring and obtained by thermally curing a varnish containing a mixture of a clay subjected to interlayer modification with a curing catalyst for a cyanate ester compound and a cyanate ester compound, wherein the amount of the clay is from 0.1 to 12 wt % of the amount of the cyanate ester compound. The invention also provides a varnish which gives the organic-inorganic composite material, and an electrical device and a semiconductor device, each of which includes the organic-inorganic composite material.

According to the invention, an organic-inorganic composite material and an electrical device, in each of which clay is highly dispersed in a cyanate ester resin, and each of which has a glass transition temperature of 200° C. or higher and therefore has high thermal stability, and also has a high electrical breakdown voltage (an electrical breakdown strength of 150 kV/mm or more) and excellent adhesiveness to a metal (an adhesive strength of 0.5 kN/m or more) can be provided.

DESCRIPTION OF THE PREFERRED EMBODIMENTS

Figure 1:
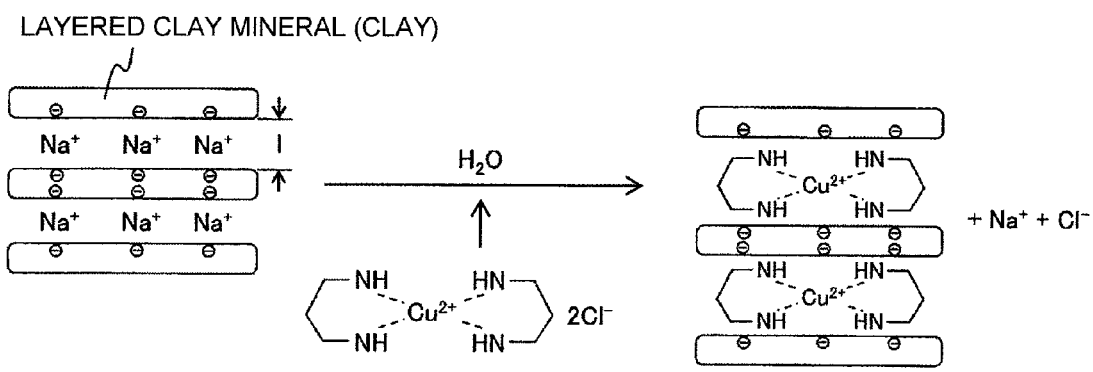
FIG. 1 is a schematic explanatory view showing a method for intercalating a curing catalyst for a cyanate ester into a clay.

As described above, the organic-inorganic composite material of the invention is an organic-inorganic composite material, which includes a resin composed of a triazine ring and obtained by thermally curing a varnish containing a mixture of a clay subjected to interlayer modification with a curing catalyst for a cyanate ester compound and a cyanate ester compound, wherein the amount of the clay is from 0.1 to 12 wt % of the amount of the cyanate ester compound.

Further, the following improvement or modification can be added to the above-described organic-inorganic composite material.

(i) The curing catalyst for the cyanate ester compound is a carboxylate salt or a metallic complex containing, as a ligand, an aliphatic amine or a heteroaromatic amine.

(ii) The clay is at least one member selected from the group consisting of a smectite group, a mica group, a vermiculite group and a mica family group.

(iii) An interlayer distance of the clay is from 1.2 to 2 nm.

(iv) The organic-inorganic composite material has a thickness of from 0.005 to 0.1 mm.

(v) The clay has a thickness of from 0.05 to 10 μm.

(vi) The curing catalyst for the cyanate ester compound is intercalated into the clay as a complex containing a transition metal element.

(vii) The transition metal element is at least one element selected from copper, zinc and manganese.

(viii) The amount of the transition metal element is from 0.1 to 12 wt % of the amount of the clay.

(ix) The amount of the transition metal element is from 0.01 to 10 wt % of the amount of the organic-inorganic composite material.

(x) The organic-inorganic composite material has a glass transition temperature of 200° C. or higher, an adhesive strength of 0.5 kN/m or more and an electrical breakdown strength of 150 kV/mm or more.

Further, the invention also provides an electrical device, including an organic-inorganic composite material, which is in contact with a metal and includes a resin composed of a triazine ring and obtained by thermally curing a varnish containing a mixture of a clay subjected to interlayer modification with a curing catalyst for a cyanate ester compound and a cyanate ester compound, wherein the amount of the clay is from 0.1 to 12 wt % of the amount of the cyanate ester compound.

Further, the invention also provides a semiconductor device, which has a structure in which the circumference of a semiconductor element is sealed by a sealant, wherein as the sealant, the organic-inorganic composite material of the invention is used.

Further, the invention also provides a varnish, including a mixture of a clay subjected to interlayer modification with a curing catalyst for a cyanate ester compound and a cyanate ester compound.

Further, the invention can add the following improvement or modification to the varnish according to the invention.

(xi) The amount of the clay is from 0.1 to 12 wt % of the amount of the cyanate ester compound.

(xii) The cyanate ester compound is 4,4'-ethylidenediphenyldicyanate, the clay is montmorillonite, and in an interlayer space of the montmorillonite, a metallic complex containing 1,3-propanediamine as a ligand is intercalated.

Further, the invention also provides an electrical wire, which is obtained by coating the circumference of a conductor with an insulating material, wherein as the insulating material, the above-described organic-inorganic composite material is used.

Further, the invention also provides a rotor coil, which is obtained by impregnating a conductor with an insulating material wound therearound with a resin, wherein as the resin used in the impregnation, the above-described organic-inorganic composite material is used.

Hereinafter, embodiments according to the invention will be more specifically described. However, the invention is not limited to the embodiments described herein, and can be combined or modified as appropriate within a range which does not change the gist of the invention.

The invention is a technique for dispersing a layered clay mineral (clay) in a cyanate ester resin (C) by subjecting the clay to interlayer modification using a metallic complex (A) serving as a curing catalyst for a cyanate ester resin and is directed to an organic-inorganic composite material in which a clay is dispersed in a thermosetting resin containing a triazine ring.

First, a method for producing the curing catalyst will be described with reference to FIG. 1 and Formulae 1 and 2. A detailed chemical reaction for the catalyst is shown in Formulae 1 and 2. In FIG. 1, when a metallic complex of an amine and a transition metal is intercalated into an interlayer space of a clay having an alkali metal such as Na in the interlayer space in water, an ion-exchange reaction is caused and the complex is intercalated into the interlayer space of the clay, whereby a curing catalyst using the clay as a support is formed.

More specifically, a metallic complex such as bis(1,3-propanediamine)copper dichloride, di-μ-hydroxo-bis(tetramethylethylenediamine)copper chloride or dichloro(1,10-phenanthroline)copper is formed in pure water (Formula 1), and the formed complex and a clay are mixed and stirred. As a result, due to an ion-exchange reaction, an alkali metal such as sodium is eluted from an interlayer space of the clay, and a cationic moiety of the metallic complex is intercalated into the interlayer space of the clay (Formula 2).

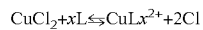

$$CuCl_2 + xL \leftrightarrows CuLx^{2+} + 2Cl \quad \text{Formula 1}$$

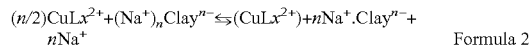

$$(n/2)CuLx^{2+} + (Na^+)_n Clay^{n-} \leftrightarrows (CuLx^{2+}) + nNa^+ \cdot Clay^{n-} + nNa^+ \quad \text{Formula 2}$$

In the Formulae 1 and 2, L represents a ligand (such as an amine) and Clay represents a clay (wherein n– in the upper right represents the total charge in the interlayer space of the clay).

As the metallic complex, a metallic complex synthesized by mixing copper chloride with an amine and reacting these components with each other may be used. By repeatedly subjecting the clay having the metallic complex intercalated therein to washing with water and filtration, alkali metal ions, halogen ions, etc. produced as by-products in the ion-exchange reaction can be removed. By drying the clay after filtration, the clay containing the metallic complex is obtained in the form of a powder. The color of the untreated clay is gray to white however, the clay powder treated with the metallic complex is colored blue, red, purple or black according to the type of the metallic complex.

Figure 2:
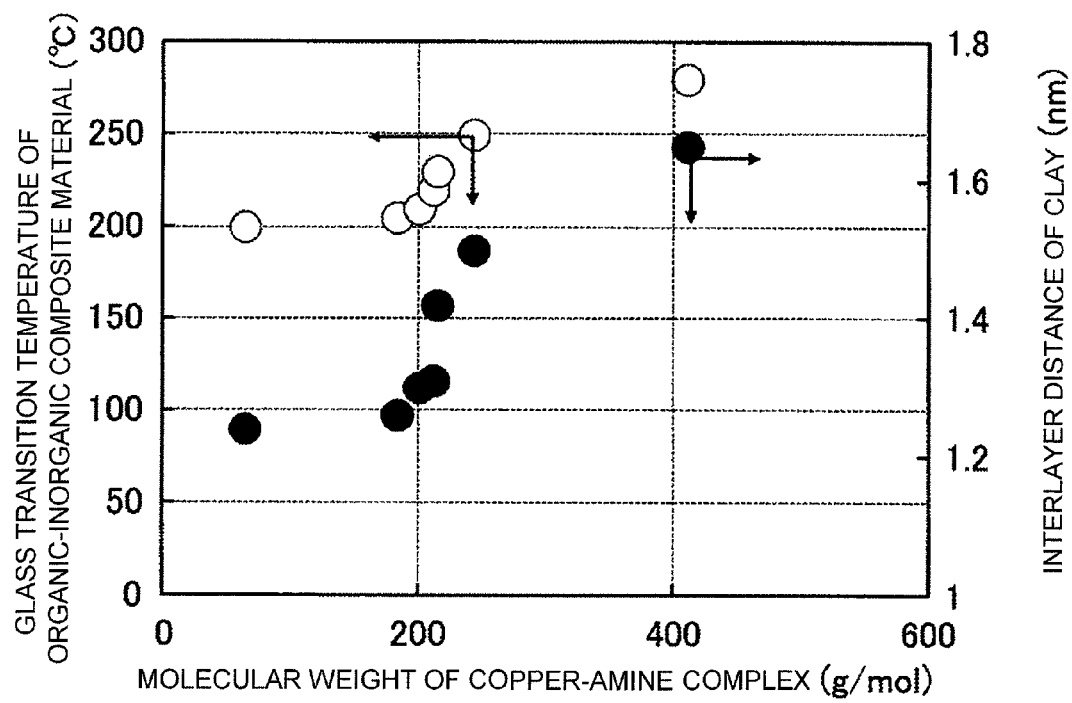
FIG. 2 is a graph showing a relationship among an interlayer distance (nm) of a clay, a glass transition temperature (° C.) of an organic-inorganic composite material and a molecular weight (g/mol) of a copper-amine complex.

The interlayer distance of the clay varies according to the molecular weight of the metallic complex. FIG. 2 shows a relationship among an interlayer distance (nm) of the clay, a glass transition temperature (° C.) of the organic-inorganic composite material obtained by adding 10 wt % of the clay and a molecular weight (g/mol) of the copper-amine complex. From FIG. 2, it is found that as the molecular weight of the metallic complex is increased, the interlayer distance is increased. It is found that the interlayer space of the clay is controlled by the molecular weight of the metallic complex to be used in the ion-exchanged reaction in this manner.

The interlayer distance of the clay varies according to the type of the clay, but is preferably from 1.2 to 2 nm. In general, the clay is in the form of a flake (flat) and has a thickness of preferably from 0.05 to 10 µm. The particle size thereof (length of one side of a flake) is preferably from 0.1 to 100 µm, particularly preferably from 1 to 50 µm. Accordingly, the organic-inorganic composite material formed using such a clay catalyst generally has a thickness of 0.005 mm or more. Here, the phrase "from 1.2 to 2 nm" refers to "1.2 nm or more and 2 nm or less".

Specific examples of the curing catalyst for the cyanate ester resin as the component (A) include a carboxylate salt or a cationic moiety of a metallic complex containing an amine as a ligand. Examples of the carboxylate salt include copper naphthenate, manganese naphthenate and zinc octylate. Examples of the metallic complex containing an amine as a ligand include a cationic moiety of bis(1,3-propanediamine) copper dichloride, di-µ-hydroxo-bis(tetramethylethylenediamine)copper chloride or dichloro(1,10-phenanthroline)copper, and these can be used alone or as a mixture of two or more of them.

The invention provides a curing catalyst for a cyanate ester compound characterized by being obtained by intercalating a carboxylate salt or a metallic complex containing an amine as a ligand, each having a catalytic activity for a resin into an interlayer space of a clay. The metal element of the metallic complex is preferably at least one member selected from the group consisting of transition metal elements such as copper, zinc and manganese. The amount of the metallic complex is preferably from 0.01 to 30 wt % of the amount of the clay.

Further, the metallic complex containing an amine as a ligand can also be synthesized from a metal salt and an amine. As the metal salt, for example, copper chloride is preferred, though it is not limited thereto. Examples of the amine include aliphatic amines such as ethylenediamine, 1,3-diaminopropane and 1,4-diaminobutane; polyethyleneamines such as diethylenetriamine and tetraethylenepentamine; and aromatic amines such as 2,4-diaminotoluene, 4,4'-methylenedianiline and 1,10-phenanthroline.

As a specific example of the clay as the component (B), at least one member selected from the mineral groups consisting of, for example, a smectite group, a mica group, a vermiculite group and a mica family group can be exemplified. Examples of the clay belonging to the smectite group include montmorillonite, hectorite, saponite, sauconite, beidellite, stevesite and nontronite. Examples of the clay belonging to the mica group include chlorite, phlogopite, lepidolite, muscovite, biotite, paragonite, margarite, tainiolite and tetrasilicic mica.

Examples of the clay belonging to the vermiculite group include trioctahedral vermiculite and dioctahedral vermiculite. Examples of the clay belonging to the mica family group include muscovite, biotite, paragonite, lepidolite, margarite, clintonite and anandite. Among these, it is preferred to use a clay belonging to the smectite group from the viewpoint of the dispersibility in the cyanate ester resin and the like. These clays can be used alone or as a mixture of two or more of them.

The clay as the component (B) has a structure in which silicate layers are laminated, and a feature of the invention is that the curing catalyst for the cyanate ester as the component (A) is intercalated into a space between the silicate layers by an ion-exchange reaction.

Specific examples of a raw material of the cyanate ester resin as the component (C) include 4,4'-ethylidenediphenyl-dicyanate, 4,4'-dicyanatobiphenyl, 3,3',5,5'-tetramethyl-4,4'-dicyanatobiphenyl, bis(4-cyanatophenyl)methane, bis(4-cyanato-3-methylphenyl)methane, bis(4-cyanato-3-t-butylphenyl)methane, bis(4-cyanato-3-i-propylphenyl)methane, bis(4-cyanato-3,5-dimethylphenyl)methane, bis(2-cyanato-3-t-butyl-5-methylphenyl)methane, 1,1-bis(4-cyanatophenyl)ethane, 1,1-bis(4-cyanato-3-methylphenyl)ethane, 1,1-bis(4-cyanato-3-t-butylphenyl)ethane, 1,1-bis(4-cyanato-3-i-propylphenyl)ethane, 1,1-bis(4-cyanato-3,5-dimethylphenyl)ethane, 1,1-bis(2-cyanato-3-t-butyl-5-methylphenyl)ethane, 2,2-bis(4-cyanatophenyl)propane, 2,2-bis(4-cyanato-3-methylphenyl)propane, 2,2-bis(4-cyanato-3-t-butylphenyl)propane, 2,2-bis(4-cyanato-3-i-propylphenyl)propane, 2,2-bis(4-cyanato-3,5-dimethylphenyl)propane, 2,2-bis(2-cyanato-3-t-butyl-5-methylphenyl)propane, 2,2-bis(4-cyanato-3-t-butyl-6-methylphenyl)propane, 2,2-bis(3-allyl-4-cyanatophenyl)propane, 1,1-bis(4-cyanatophenyl)butane, 1,1-bis(4-cyanato-3-methylphenyl)butane, 1,1-bis(4-cyanato-3-t-butylphenyl)butane, 1,1-bis(4-cyanato-3-i-propylphenyl)butane, 1,1-bis(4-cyanato-3,5-dimethylphenyl)butane, 1,1-bis(2-cyanato-3-t-butyl-5-methylphenyl)butane, 1,1-bis(4-cyanato-3-t-butyl-6-methylphenyl)butane, 1,1-bis(3-allyl-4-cyanatophenyl)butane, 1,1-bis(4-cyanatophenyl)cyclohexane, 1,1-bis(4-cyanato-3-methylphenyl)cyclohexane, bis(4-cyanatophenyl)sulfide, bis(4-cyanato-3-methylphenyl)sulfide, bis(4-cyanato-3-t-butylphenyl)sulfide, bis(4-cyanato-3-i-propylphenyl)sulfide, bis(4-cyanato-3,5-dimethylphenyl)sulfide, bis(2-cyanato-3-t-butyl-5-methylphenyl)sulfide, bis(4-cyanatophenyl)sulfone, bis(4-cyanato-3-methylphenyl)sulfone, bis(4-cyanato-3-t-butylphenyl)sulfone, bis(4-cyanato-3-i-propylphenyl)sulfone, bis(4-cyanato-3,5-dimethylphenyl)sulfone, bis(2-cyanato-3-t-butyl-5-methylphenyl)sulfone, bis(4-cyanatophenyl)ether, bis(4-cyanato-3-methylphenyl)ether, bis(4-cyanato-3-t-butylphenyl)ether, bis(4-cyanato-3-i-propylphenyl)ether, bis(4-cyanato-3,5-dimethylphenyl)ether, bis(2-cyanato-3-t-butyl-5-methylphenyl)ether, bis(4-cyanatophenyl)carbonyl, bis(4-cyanato-3-methylphenyl)carbonyl, bis(4-cyanato-3-t-butylphenyl)carbonyl, bis(4-cyanato-3-i-propylphenyl)carbonyl, bis(4-cyanato-3,5-dimethylphenyl)carbonyl and bis(2-cyanato-3-t-butyl-5-methylphenyl)carbonyl, and two or more compounds can also be used as needed.

Further, in the raw material of the cyanate ester resin as the component (C), an organic solvent such as methyl ethyl ketone or methyl cellosolve; a carboxylate salt, which is a curing catalyst for a cyanate ester resin, such as copper naphthenate, manganese naphthenate or zinc octylate; a phenolic compound, which is a coenzyme for a cyanate ester resin, such as nonyl phenol; a silane coupling agent such as γ-glycidoxy propyl trimethoxy silane; or an inorganic filler such as alumina, silica or boron nitride may be contained in a given amount.

The blending amount of the clay as the component (B) is from 0.1 to 30 wt %, particularly preferably from 0.1 to 12 wt % with respect to 100 wt % of the cyanate ester resin as the component (C). If the amount of the clay is less than 0.1 wt %, it may not be able to sufficiently enhance the electrical insulation and adhesiveness. Further, if the amount of the clay exceeds 30 wt %, the electrical insulation may be decreased. The blending amount of the clay as the component (B) is more preferably set in a range of from 1 to 12 wt %.

Further, the invention also provides: a varnish containing a mixture of a clay subjected to interlayer modification with a curing catalyst for a cyanate ester compound, a cyanate ester compound and a reactive solvent; and an organic-inorganic composite material obtained by curing the varnish.

A method for producing an organic-inorganic composite material of this embodiment will be described in detail. The varnish according to this embodiment can be produced by performing a first step in which a curing catalyst is intercalated into a clay and mixing the clay prepared in the first step and a cyanate ester resin raw material. The obtained varnish is transparent and is colored blue, red or black according to the type of the metallic complex used in the interlayer modification of the clay. The mixing of the clay and the cyanate ester resin raw material can be carried out by applying a mechanical shearing force using a ball mill or the like.

Further, by thermally curing the varnish, the organic-inorganic composite material can be produced. The thermal stability, electrical insulation and adhesiveness of the organic-inorganic composite material can be controlled to desired properties according to the type of the metallic complex.

Figure 3:
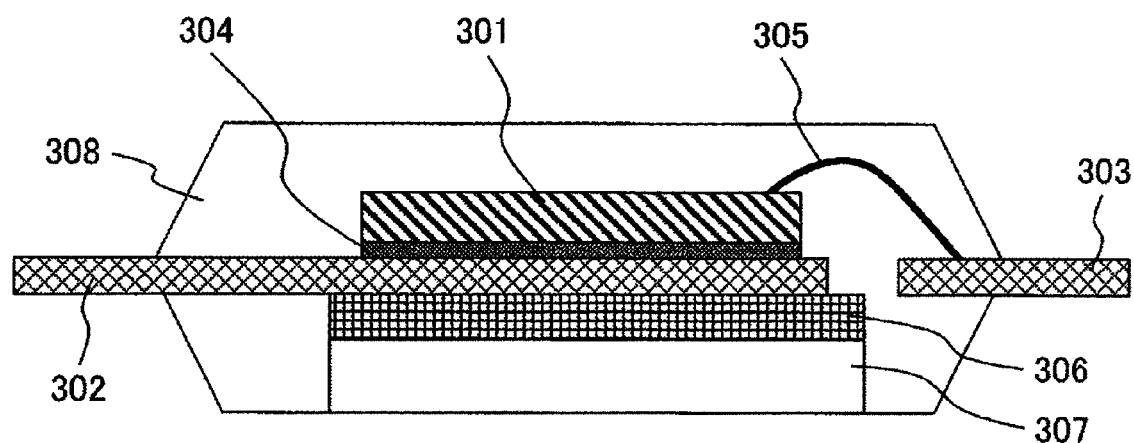
FIG. 3 is a schematic cross-sectional view showing a power semiconductor device to which an organic-inorganic composite material of the invention is applied.

FIG. 3 is a schematic cross-sectional view showing a power semiconductor device. In the power semiconductor device shown in FIG. 3, a back-side electrode of a power semiconductor element 301 is electrically connected to a circuit wiring member 302 on an insulating substrate 306 through a bonding material 304, and a main electrode of the power semiconductor element 301 is electrically connected to a lead member 303 through a wire 305. On the back side surface of the insulating substrate 306, a radiator plate 307 for radiating heat generated in the power semiconductor element 301 to the outside is provided. Then, the circumference of the power semiconductor element 301 is sealed by a molding resin 308 in a state where portions of the circuit wiring member 302, the lead member 303 and the radiator plate 307 are exposed. As the molding resin 308, the organic-inorganic composite material of the invention can be used.

Figure 4A:
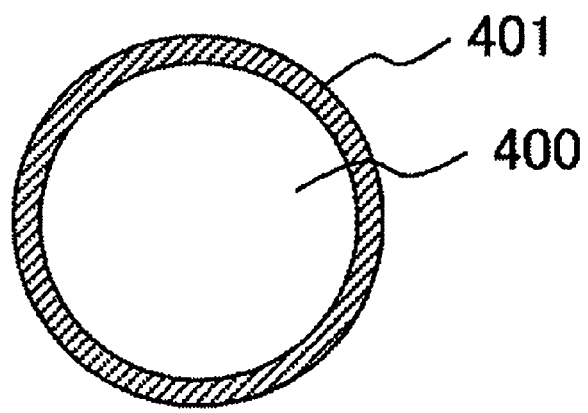
FIG. 4A is a schematic cross-sectional view showing an insulated electrical wire produced using a varnish containing a clay and a resin raw material according to the invention.

FIG. 4A is a cross-sectional view showing an insulated electrical wire produced using the varnish containing the clay and the resin raw material of the invention. On a conductor 400, an insulating coat 401 which comprises the varnish of the invention is formed and baked. Since the resulting organic-inorganic composite film according to the invention exhibits a high electrical breakdown voltage and a high adhesive strength to a metal, an insulated electrical wire having excellent surge resistance can be obtained.

It is apparent that, similarly, the organic-inorganic composite material of the invention can be used as other thin-film insulating coat. For example, the organic-inorganic composite material of the invention can be used as an insulating coat for a metal wire, etc. Therefore, according to the invention, an electrical device, characterized by comprising an organic-inorganic composite material, which is in contact with a metal and includes a resin composed of a triazine ring and obtained by thermally curing a varnish containing a mixture of a clay subjected to interlayer modification with a curing catalyst for a cyanate ester compound and a cyanate ester compound, wherein the amount of the clay is from 0.1 to 12 wt % of the amount of the cyanate ester compound is provided.

Figure 4B:
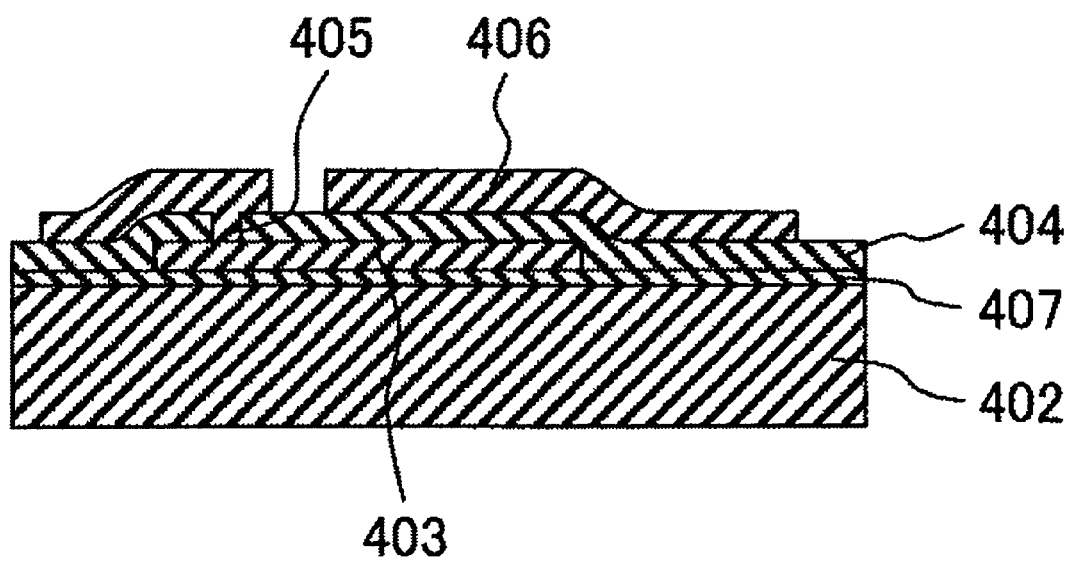
FIG. 4B is a schematic cross-sectional view showing an electrical device produced using a varnish containing a clay and a resin raw material according to the invention.

FIG. 4B is a schematic view showing a structure of an electrical device, in which an insulating thin film 404 coating a surface of a wire circuit 403 (which may contain an electronic component) formed directly or through another film 407 on an insulating substrate 402 is formed. This insulating thin film 404 is the organic-inorganic composite material of the invention and the wire circuit 403 is connected to another circuit 406 through a through-hole 405 provided in the insulating thin film 404. FIG. 4B shows one example, and the wire circuit may comprise one layer and be simply coated with the insulating thin film 404.

The organic-inorganic composite material of the invention has a high electrical breakdown strength (150 kV/mm or more), and therefore can prevent short-circuiting of chip and wire due to partial discharge. Further, the organic-inorganic composite material of the invention has a high glass transition temperature (200° C. or higher) and shows a small change in elastic modulus or thermal expansion with respect to a change in temperature, and therefore can suppress thermal stress caused by a change in temperature accompanying the generation of heat in a power element when the material is used in a sealant for a power semiconductor device. Further, the organic-inorganic composite material of the invention has a high adhesive strength (0.5 kN/mm or more) to a metal member, and therefore can prevent damage to a power semiconductor device such as peeling from a member even if thermal stress is generated. Accordingly, the organic-inorganic composite material of the invention can be expected to contribute not only to the enhancement of the reliability of the power semiconductor device, but also to the prolongation of the life of the power semiconductor device because the organic-inorganic composite material of the invention has high thermal stability. The structure of the power semiconductor device shown in FIG. 3 is one example, and it is a matter of course that the organic-inorganic composite material of the invention can be applied as a molding resin to coat the circumference of the semiconductor element 301 also in a semiconductor device having another structure.

Figure 5:
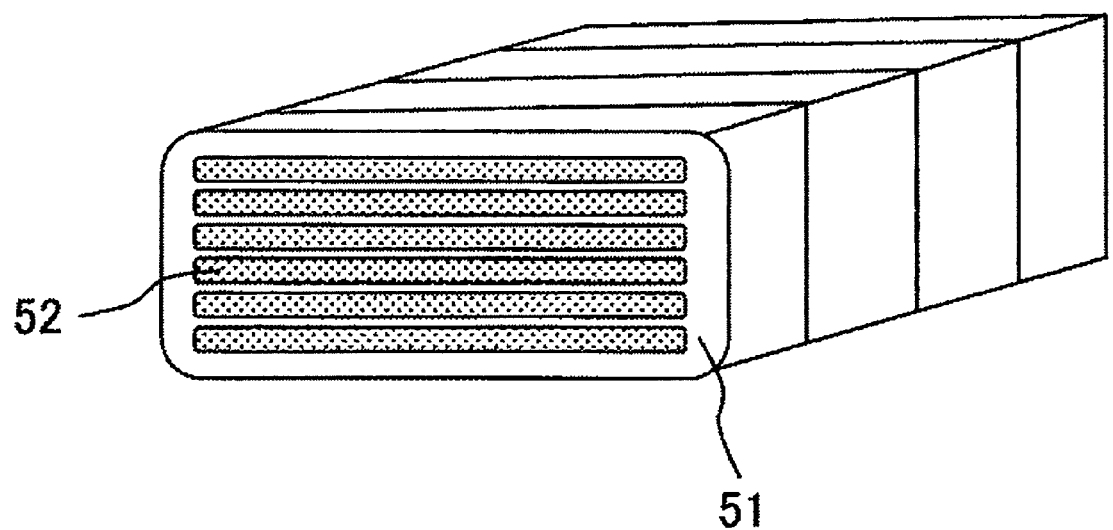
FIG. 5 is a schematic cross-sectional view showing a structure of a rotor coil to which an organic-inorganic composite material of the invention is applied.

FIG. 5 is a schematic view showing a structure of a rotor coil to be used in a motor or a power generator. An insulating tape 51 is wound around a conductor 52, followed by heating and drying. Thereafter, the resulting material is vacuum-impregnated with the varnish containing the clay and the resin raw material of the invention and then thermally cured, whereby a rotor coil shown in FIG. 5 can be obtained. The thus obtained rotor coil is coated with a resin having high thermal stability, and therefore has a high thermal stability index.

Next, the invention will be described with reference to Examples and Comparative Examples, however, the invention is not limited thereto.

Production of Examples 1 to 24

Kunipia F manufactured by Kunimine Industries Co., Ltd. as the layered clay mineral (clay) was added to pure water, and the resulting mixture was stirred for 2 hours while maintaining the temperature at 80° C., whereby a milky white dispersion liquid in which Kunipia F was dispersed in water in a white turbid state was obtained. Separately, a solution was prepared by dissolving a copper complex containing, as a ligand, ethylenediamine (Examples 4 to 6), diethylenetriamine (Examples 7 to 9), 1,3-propanediamine (Examples 10 to 15), tetraethylenepentamine (Examples to 18), 1,10-phenanthroline (Examples 19 to 21) or 4,4'-methylenedianiline (Examples 22 to 24) in pure water, and the thus prepared solution was poured into the above-prepared clay dispersion liquid.

By further stirring the resulting mixture at 80° C. for 2 hours, an ion-exchange reaction was caused between sodium ions in an interlayer space of the clay and each of the metallic complexes, whereby a clay subjected to interlayer modification, in which the sodium ions in the interlayer space were substituted by the metallic complex was obtained. This reaction mechanism is illustrated in the above-described Formulae 1 and 2 and FIG. 1. In Examples 1 to 3 and the below-described Reference Example 1, a copper complex which did not contain a ligand was intercalated into an interlayer space of the clay.

Incidentally, Reference Examples in this specification are configured such that although a metallic complex is intercalated into an interlayer space of the clay in the same manner as in the invention, the addition amount of the clay is not within the preferred range of the invention. Therefore, Reference Examples are not known per se, but are described for showing the importance of the addition amount of the clay of the invention.

The above metallic complex can be synthesized also by the following method. Copper(II) chloride is dissolved in pure water, and any of the above amines is mixed in the solution. By doing this, an amine is coordinated to copper, and an aqueous solution in which the copper complex is dissolved is formed. By adding the clay to this solution, the reaction represented by Formulae 1 and 2 and shown in FIG. 1 proceeds, and the metallic complex can be intercalated into the interlayer space of the clay.

After intercalating the metallic complex into the interlayer space of the clay by the above-described method, the clay was separated by filtration under reduced pressure. At this time, it was confirmed that the filtrate was colored blue, red or black. The clay was dispersed in pure water again, and redispersion and filtration under reduced pressure were alternately repeated until the color of the filtrate became transparent, whereby the unreacted copper complex, sodium ions, chlorine ions, etc. in the dispersion liquid were completely removed.

The clay after washing was dried under reduced pressure at 75° C. for 12 hours, whereby water was completely removed. It was confirmed that the dried clay was colored blue, red or black according to the type of the metallic complex intercalated into the clay. Further, it was also confirmed that in the dried clay, sodium and chlorine were not contained by a fluorescent X-ray analysis. Thermal gravimetric analysis revealed that the amount of the metallic complex was from 0.1 to 30 wt % of amount of the clay.

The dried clay, Primaset LECy manufactured by Lonza Co., Ltd. (chemical name: 4,4'-ethylidene diphenyl dicyanate), and 4-nonylphenol manufactured by Tokyo Chemical Industry Co., Ltd. were weighed and placed in an agate container with agate balls and mixed by a ball mill for 2 hours. The addition amount of the dried clay was changed from 1 to 12 wt %. The ball mill was operated in a mode in which the rotation speed was 450 rpm and the direction of rotation was reversed at 5-minute intervals. By doing this, a varnish in which the clay subjected to interlayer modification with the metallic complex was dispersed in the resin raw material was obtained. The varnish was heated at 100° C. for 1 hour, at 120° C. for 1 hour, at 150° C. for 1 hour, at 200° C. for 1 hour, and at 250° C. for 6 hours in this order, whereby an organic-inorganic composite material was obtained.

Production of Reference Examples 1 to 7

Organic-inorganic composite materials were obtained in the same manner as in Examples 1 to 24 except that the addition amount of the clay was changed to 15 wt %, which is outside the preferred range (from 1 to 12 wt %) of the invention.

Production of Comparative Example 1

An organic-inorganic composite material was obtained in the same manner as in Examples 1 to 24 except that the clay was not added.

Production of Comparative Examples 2 to 5

Organic-inorganic composite materials were obtained in the same manner as in Examples 1 to 24 except that the clay to be added was changed to an untreated clay (Kunipia F) in which the metallic complex was not intercalated into the interlayer space. The ligand, the molecular weight of the ligand, the coordination number, the molecular weight of the copper complex, the addition amount of the clay with respect to the amount of the cyanate ester compound in the inorganic-organic composite material of each of Examples 1 to 24, Reference Examples 1 to 7 and Comparative Examples 1 to 5 are shown in Table 1 (shown below).

(Measurement and Evaluation)

(1) XRD Measurement (Evaluation of Interlayer Distance)

Figure 9:
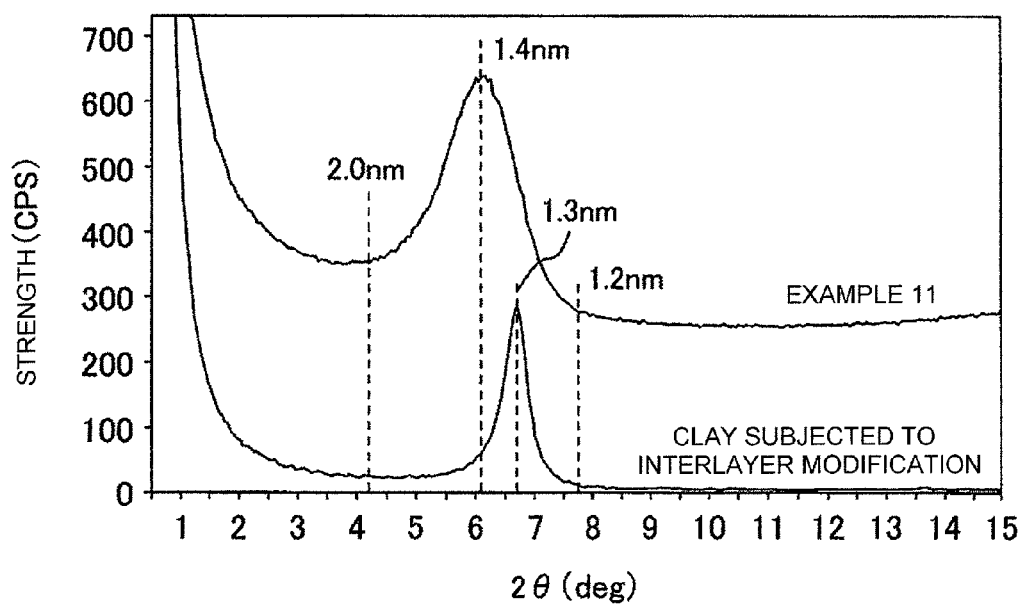
FIG. 9 is a graph showing the results of XRD measurement of Example 11.

An interlayer distance of each of the dried clays of Examples 1 to 24, Reference Examples 1 to 7 and Comparative Examples 1 to 5 was measured using a high-resolution X-ray diffractometer (manufactured by Rigaku Co., Ltd., model: ATX-G). The measurement conditions were set as follows: X-ray source: Cu; X-ray output spectrum: 50 kV, 250 mA; and scanning range: $0.5° \leq 2\theta \leq 60°$. From the measured XRD pattern, an interplanar spacing was calculated using the Bragg's equation ($2d \sin \theta = n\lambda$, d: interplanar spacing, $\theta$: angle of diffraction, n: order of reflection, $\lambda$: X-ray wavelength=0.154 nm). The evaluation results of Examples 1 to 24, Reference Examples 1 to 7 and Comparative Examples 1 to 5 are shown in Table 1. Further, the evaluation results of Example 11 are shown in FIG. 9.

(2) Measurement of Dynamic Viscoelasticity (Evaluation of Glass Transition Temperature)

The elastic modulus of an organic-inorganic composite material was obtained by the measurement of dynamic viscoelasticity (dynamic mechanical analysis, DMA) using a dynamic viscoelasticity meter (manufactured by TA Instruments Co., Ltd., model: TA-2000) under the following conditions: temperature increasing rate: 2° C./min; distance between chucks: 10 to 20 mm; thickness of sample: about 0.5 mm; and measurement frequency: 10 Hz. The glass transition temperature was obtained from the tan $\delta$ peak temperature obtained by the above DMA measurement. The evaluation results of Examples 1 to 24, Reference Examples 1 to 7 and Comparative Examples 1 to 5 are shown in Table 1.

(3) Measurement of Electrical Breakdown Voltage (Evaluation of Electrical Breakdown Strength)

Figure 6:
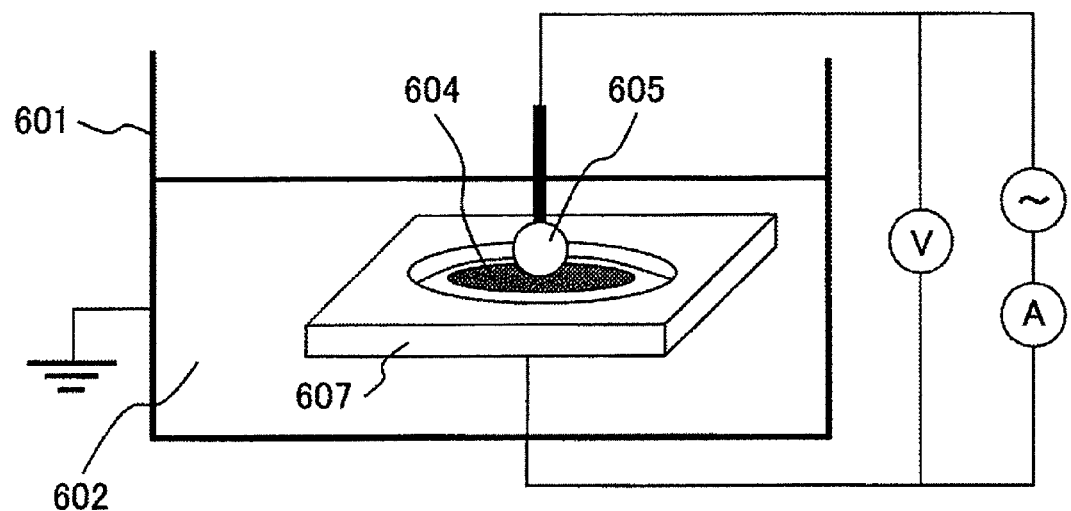
FIG. 6 is a schematic view showing a device for measuring an electrical breakdown voltage.

The electrical breakdown voltage of each of the organic-inorganic composite materials of Examples 1 to 24, Reference Examples 1 to 7 and Comparative Examples 1 to 5 was measured as follows. In the measurement, a breakdown voltage meter (manufactured by Sasaki Electric Corporation) was used. FIG. 6 shows a schematic view of the measurement device. As an electrode plate, an aluminum plate 607 with a size of 100 mm×100 mm×5 mmt having a recess with a diameter of 80 mm and a depth of 1 mm formed on one surface thereof was used. 1 to 2 g of a resin raw material was poured in the recess and heated at 100° C. for 1 hour, at 120° C. for 1 hour, at 150° C. for 1 hour, at 200° C. for 1 hour, and at 250° C. for 6 hours in this order. Then, a spherical electrode 605 with a diameter of 5 mm was pressed against the surface of the organic-inorganic composite material 604 on the aluminum plate 607, and a voltage at a commercial frequency (50 Hz) was applied between the aluminum plate 607 and the spherical electrode 605 while gradually increasing the voltage (voltage increasing rate: 1 kV/sec). A voltage when a short-circuiting current flowed was determined as a breakdown voltage $V_{TOP}$ (kV). The sample 604 to be measured, the spherical electrode 605 and the aluminum plate 607 were immersed in an electrical insulating oil (Florinate (registered trademark) manufactured by SUMITOMO 3M, Inc., FC-77) 602 filled in a polypropylene case 601.

Figure 10:
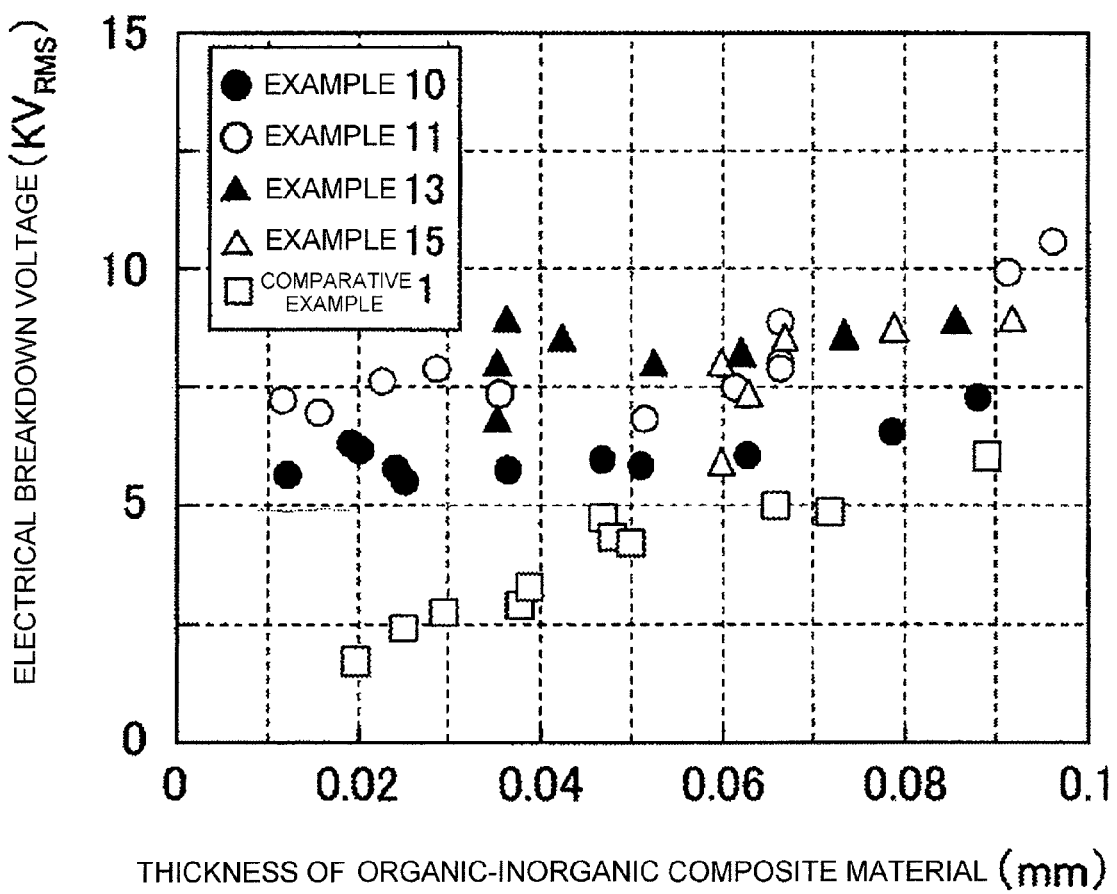
FIG. 10 is a graph showing a relationship between an electrical breakdown voltage and a thickness of an organic-inorganic composite material of each of Examples 10, 11, 13 and 15.

From the $V_{TOP}$, an effective voltage VRMS (electrical breakdown voltage)=$V_{TOP}/\sqrt{2}$ was calculated, and the VRMS was divided by the thickness of the film (0.05 mm) and the obtained result was determined as an electrical breakdown strength. The results of the evaluation of VRMS (electrical breakdown voltage) of Examples 10, 11, 13 and 15 are shown in FIG. 10, and the electrical breakdown strengths of Examples 1 to 24, Reference Examples 1 to 7 and Comparative Examples 1 to 5 are shown in Table 1.

(4) Measurement of Copper Foil Peel Strength (Evaluation of Adhesive Strength)

The adhesive strength of an organic-inorganic composite material was evaluated as follows. About 1 g of a resin raw material was dropped on an aluminum plate with a size of 100 mm×100 mm×5 mmt, and a glossy surface of a 35-μm copper foil was brought into contact with the resin raw material and bonded thereto. Then, the resulting material was heated at 100° C. for 1 hour, at 120° C. for 1 hour, at 150° C. for 1 hour, at 200° C. for 1 hour, and at 250° C. for 6 hours in this order, whereby a sample for measuring a peel strength was prepared. In the measurement, a digital force gauge (manufactured by Japan Instrumentation System Co., Ltd.) was used. A peel strength when the copper foil was peeled at an angle of 90° was obtained. The measurement results are shown in Table 1.

(5) Measurement of Infrared Spectrum

Figure 7:
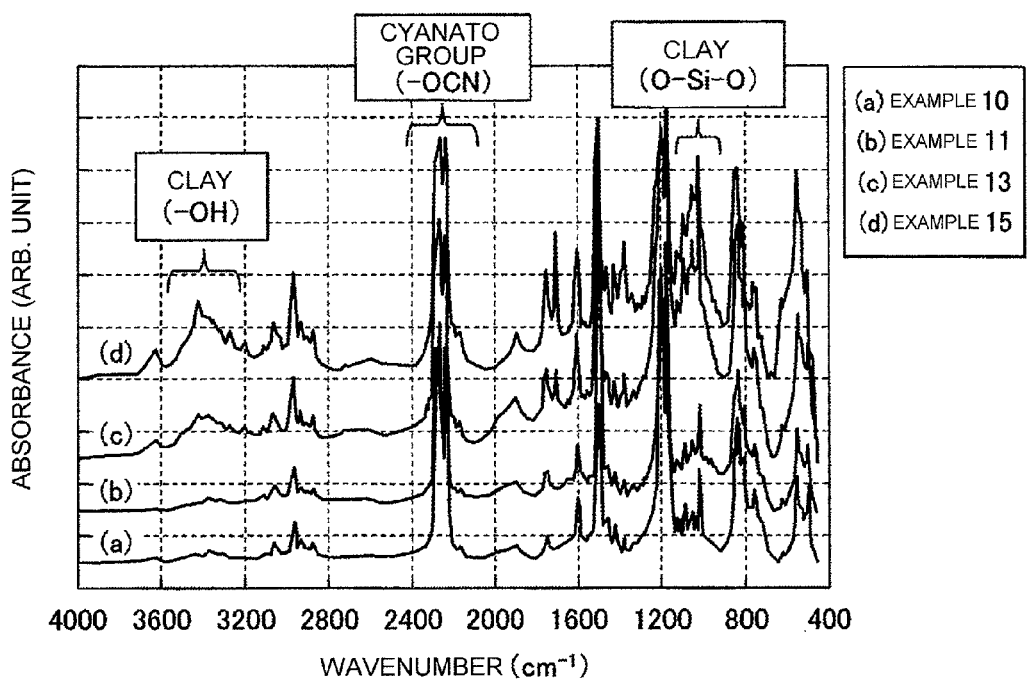
FIG. 7 is a graph showing the results of measurement of FT-IR spectra of Examples 10, 11, 13 and 15.
Figure 8:
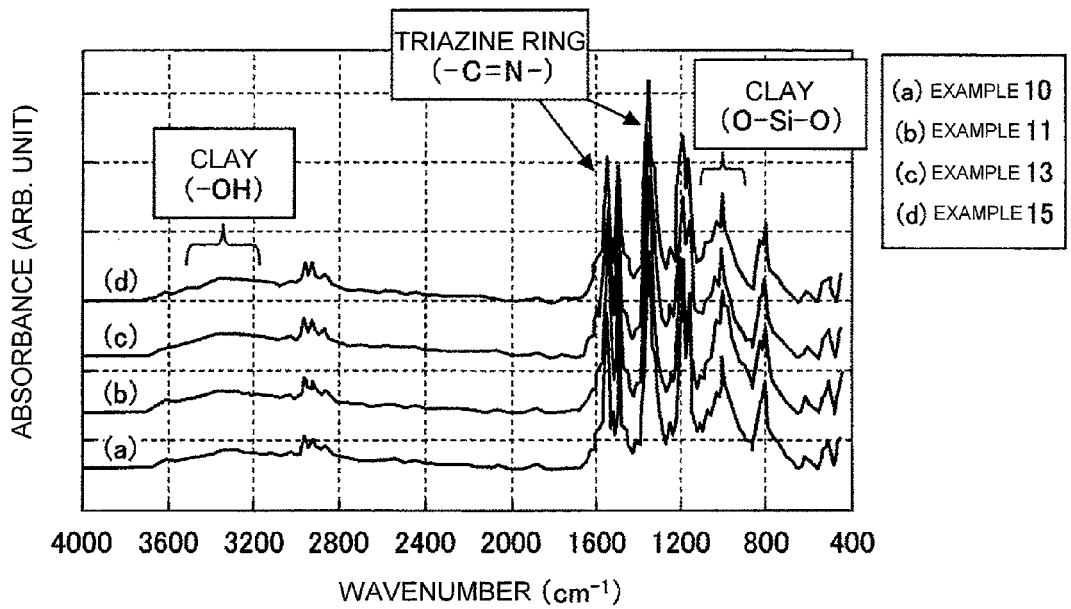
FIG. 8 is a graph showing the results of measurement of FT-IR spectra of Examples 10, 11, 13 and 15.

The infrared absorption spectrum of each of the varnishes and the organic-inorganic composite materials of Examples 10, 11, 13 and 15 was measured using an infrared spectrometer (manufactured by PerkinElmer Co., Ltd., Spectrum 100). The measurement was performed by a transmission method in the case of the varnishes, and by an ATR method in the case of the composite materials. The measurement conditions were set as follows: measurement range: 380 to 4000 cm$^{-1}$, measurement interval: 1 cm$^{-1}$, and cumulated number: 12. The results of the measurement of the varnishes are shown in FIG. 7, and the results of the measurement of the organic-inorganic composite materials are shown in FIG. 8.

(6) SEM Observation

Figure 11A:
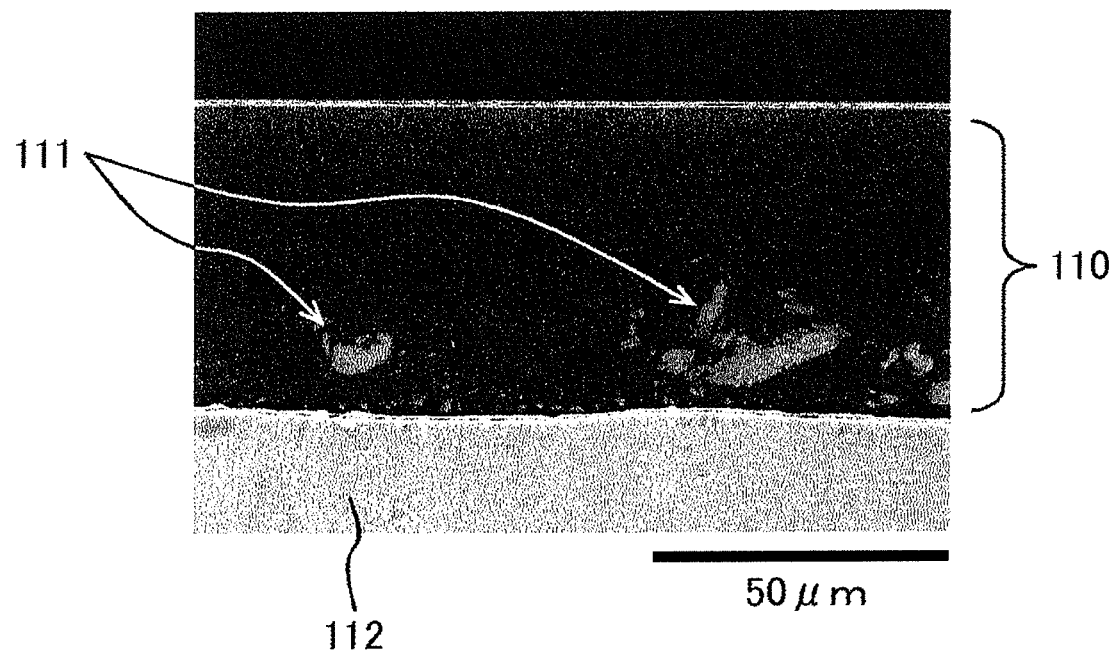
FIG. 11A is a cross-sectional SEM image of Example 11.

The shape of a cross section of the organic-inorganic composite material of Example 11 was observed by a scanning electron microscope (SEM, manufactured by Hitachi High Technologies Co., Ltd., model: S-4800). The observation was carried out at an accelerating voltage of 5 kV. Further, an elementary analysis was carried out by an energy dispersive X-ray analyzer (manufactured by Horiba Ltd., model: EX-350), and the location of the clay in the SEM image was identified. The measurement was carried out at an accelerating voltage of 15 kV. The SEM image of the organic-inorganic composite material of Example 11 is shown in FIG. 11A.

(7) TEM Observation

The dispersion state of the clay in the organic-inorganic composite material of Example 11 was observed by a transmission electron microscope (TEM, manufactured by Hitachi High Technologies Co., Ltd., model: H-9000NAR). As for a sample to be observed, a portion located at a depth of about 6 μm from the surface of the organic-inorganic composite material was collected using a focused ion beam (FIB) processing method. The TEM observation was carried out at an accelerating voltage of 300 kV. Further, an elementary analysis was carried out by an energy dispersive X-ray analyzer (manufactured by AMETEK, Inc., model: Genesis APEX 2), and the location of the clay in the TEM image was identified. The TEM image of the organic-inorganic composite material of Example 11 is shown in FIG. 11A.

TABLE 1

| | Clay | | | | Organic-inorganic composite material | | | |
|---|---|---|---|---|---|---|---|---|
| | Ligand | Molecular weight of ligand (g/mol) | Coordination number | Molecular weight of copper complex (g/mol) | Interlayer distance | Addition amount of clay (wt %) | Glass transition temperature (° C.) | Electrical breakdown strength (kV/mm) | Adhesive strength (kN/m) |
| Example 1 | — | — | — | 64.5 | 1.24 | 1 | 260 | 151 | 0.56 |
| Example 2 | | | | | | 5 | 240 | 152 | 0.64 |
| Example 3 | | | | | | 10 | 200 | 161 | 0.74 |
| Reference Example 1 | | | | | | 15 | 175 | 130 | 0.82 |
| Example 4 | Ethylene-diamine | 60.1 | 2 | 183.7 | 1.26 | 1 | 270 | 150 | 0.52 |
| Example 5 | | | | | | 5 | 250 | 155 | 0.64 |
| Example 6 | | | | | | 10 | 205 | 160 | 0.75 |
| Reference Example 2 | | | | | | 15 | 180 | 140 | 0.88 |
| Example 7 | Diethylene-triamine | 103.17 | 1.3 | 200.7 | 1.3 | 1 | 274 | 153 | 0.54 |
| Example 8 | | | | | | 5 | 240 | 150 | 0.63 |
| Example 9 | | | | | | 10 | 210 | 161 | 0.74 |
| Reference Example 3 | | | | | | 15 | 190 | 130 | 0.82 |
| Example 10 | 1,3-Propane-diamine | 74.12 | 2 | 211.7 | 1.31 | 1 | 276 | 151 | 0.54 |
| Example 11 | | | | | | 3 | 266 | 152 | 0.60 |
| Example 12 | | | | | | 5 | 250 | 152 | 0.63 |
| Example 13 | | | | | | 6 | 232 | 154 | 0.83 |
| Example 14 | | | | | | 10 | 200 | 155 | 0.74 |
| Example 15 | | | | | | 12 | 204 | 125 | 0.86 |
| Reference Example 4 | | | | | | 15 | 180 | 120 | 0.84 |
| Example 16 | Tetraethylene-pentamine | 189.3 | 0.8 | 214.9 | 1.42 | 1 | 280 | 152 | 0.55 |
| Example 17 | | | | | | 5 | 270 | 155 | 0.68 |
| Example 18 | | | | | | 10 | 230 | 156 | 0.76 |
| Reference Example 5 | | | | | | 15 | 220 | 130 | 0.84 |
| Example 19 | 1,10-Phenan- | 180 | 1 | 243.5 | 1.5 | 1 | 290 | 153 | 0.56 |

TABLE 1-continued

| | | Clay | | | | Organic-inorganic composite material | | | |
|---|---|---|---|---|---|---|---|---|---|
| | Ligand | Molecular weight of ligand (g/mol) | Coordination number | Molecular weight of copper complex (g/mol) | Interlayer distance | Addition amount of clay (wt %) | Glass transition temperature (° C.) | Electrical breakdown strength (kV/mm) | Adhesive strength (kN/m) |
| Example 20 | throline | | | | | 5 | 280 | 155 | 0.62 |
| Example 21 | | | | | | 10 | 250 | 157 | 0.76 |
| Reference Example 6 | | | | | | 15 | 240 | 122 | 0.85 |
| Example 22 | 4,4'-Methylene-dianiline | 173.3 | 2 | 410.1 | 1.65 | 1 | 295 | 154 | 0.56 |
| Example 23 | | | | | | 5 | 288 | 155 | 0.64 |
| Example 24 | | | | | | 10 | 270 | 155 | 0.74 |
| Reference Example 7 | | | | | | 15 | 260 | 123 | 0.85 |
| Comparative Example 1 | | — | | | — | | 302 | 80 | 0.44 |
| Comparative Example 2 | | Untreated clay (Kunipia F) | | | 1.23 | 1 | 190 | 30 | 0.31 |
| Comparative Example 3 | | | | | | 5 | 182 | 10 | 0.22 |
| Comparative Example 4 | | | | | | 10 | 175 | 5 | 0.25 |
| Comparative Example 5 | | | | | | 15 | 150 | 2 | 0.32 |

As shown in Table 1, the organic-inorganic composite materials of Examples 1 to 24 according to the invention could satisfy all of the following requirements: glass transition temperature: 200° C. or higher; electrical breakdown strength: 150 kV/mm or more; and adhesive strength: 0.5 kN/m or more. On the other hand, the organic-inorganic composite material of Comparative Example 1 had lower values with respect to both of the electrical breakdown strength and the adhesive strength than those according to the invention although the glass transition temperature thereof was high. Further, the organic-inorganic composite materials of Comparative Examples 2 to 5 had lower values with respect to all of the glass transition temperature, the electrical breakdown strength and the adhesive strength than those according to the invention.

The organic-inorganic composite materials of Reference Examples 1 to 7 had higher values with respect to the electrical breakdown strength and the adhesive strength than those of Comparative Examples 1 to 5, but could not satisfy all of the following requirements: glass transition temperature: 200° C. or higher; electrical breakdown strength: 150 kV/mm or more; and adhesive strength: 0.5 kN/m or more unlike the organic-inorganic composite materials of Examples 1 to 24.

It was found from the relationship between the molecular weight of the copper complex containing any of various ligands and the interlayer distance of the clay that as the molecular weight of the copper complex is increased, the interlayer distance of the clay obtained is increased. This is because due to a volume effect of the copper complex, the interlayer space of the clay is expanded by pushing the layers. In addition, as the molecular weight of the copper complex is increased, the glass transition temperature of the organic-inorganic composite material is increased. It is considered that this is because as the molecular weight of the copper complex is increased, the interlayer space of the clay is expanded by pushing the layers, and also as the molecular weight of the copper complex is increased, the affinity between the ligand and the monomer is increased, and therefore, the monomer is efficiently diffused in the interlayer space of the clay, and the catalytic activity of the copper complex is effectively exhibited.

On the other hand, in the case of the organic-inorganic composite materials of Comparative Examples 2 to 5 in which the untreated clay was added, the interlayer distance of the clay was as small as 1.23 nm, and sodium ions which do not have a ligand has low affinity for the monomer, and therefore, the catalytic activity of the sodium ions were not sufficiently exhibited, accordingly, the glass transition temperature thereof was 200° C. or lower.

In Examples 1 to 24, the electrical breakdown strength was 150 kV/mm or more and was increased as the addition amount of the clay was increased in the case where the addition amount of the clay was 10 wt % or less whichever type of copper complex was used, however, in the case where the addition amount of the clay was 15 wt %, the electrical breakdown strength was decreased to 140 kV/mm or less. It is considered that this is because when the addition amount of the clay is large, the amount of the copper complex intercalated into the interlayer space of the clay is increased, and the copper complex functions as conductive ions.

In Examples 1 to 24, the adhesive strength showed a tendency to increase as the addition amount of the clay was increased whichever type of copper complex was used. Further, the value thereof was 0.5 kN/m or more. On the other hand, in Comparative Examples 1 to 5, the adhesive strength was 0.44 kN/m or less. It is considered that the reason why a high adhesive strength was exhibited in Examples 1 to 24 is that the amine which is a ligand of the copper complex acts on the metal which is an adherend.

From FIG. 7, in the case of the varnishes of Examples 10, 11, 13 and 15, absorbances derived from a cyanato group contained in the cyanate ester compound, and a hydroxy group and an O—Si—O bond contained in the clay were observed. On the other hand, although not shown, in the case of Comparative Example 1, only an absorbance derived from a cyanato group was observed, and an absorbance derived from the clay was not observed.

Further, From FIG. 8, in the case of the organic-inorganic composite materials of Examples 10, 11, 13 and 15, absorbances derived from the triazine ring and the clay were observed. On the other hand, although not shown, in the case of Comparative Example 1, only an absorbance derived from the triazine ring was observed, and an absorbance derived from the clay was not observed.

Further, From FIG. 9, the interplanar spacing of the clay subjected to interlayer modification in Example 11 was about 1.3 nm, and the interplanar spacing of the clay in the organic-inorganic composite material synthesized in Example 11 obtained by adding the clay subjected to interlayer modification was about 1.4 nm (distributed between 1.2 nm and 2 nm).

The electrical breakdown voltages shown in FIG. 10 were obtained by the above-described evaluation method shown in FIG. 6. From FIG. 10, the electrical breakdown voltages of the organic-inorganic composite materials synthesized in Examples 10, 11, 13 and 15 were from 5 to 10 kV in the case where the thickness of the composite material was 0.1 mm or less. From the results of Comparative Example 1, the electrical breakdown voltages of the resin without addition of the clay were about 5.5 kV or less in the case where the thickness of the composite material was 0.1 mm or less. From the results of Examples 10, 11, 13 and 15, it was considered that a decrease in electrical breakdown voltage was caused when the film thickness was less than 0.005 mm in the case where the addition amount of the clay exceeded 12 wt %. Therefore, it was found that the addition amount of the clay is preferably 12 wt % or less of the amount of the cyanate ester compound.

FIG. 11A shows an SEM image of a cross section of the organic-inorganic composite material synthesized in Example 11. From the results of the elementary analysis, it was found that lumps 111 (representative lumps are indicated by arrows) which look white in the image comprise the clay. As for the clay in the organic-inorganic composite material 110, the largest clay lump having a long side with a length of about 30 μm and a short side with a length (the thickness of the clay) of about 10 μm was observed, and a state in which clay lumps having various sizes are present together in the material 110 was observed.

Figure 11B:
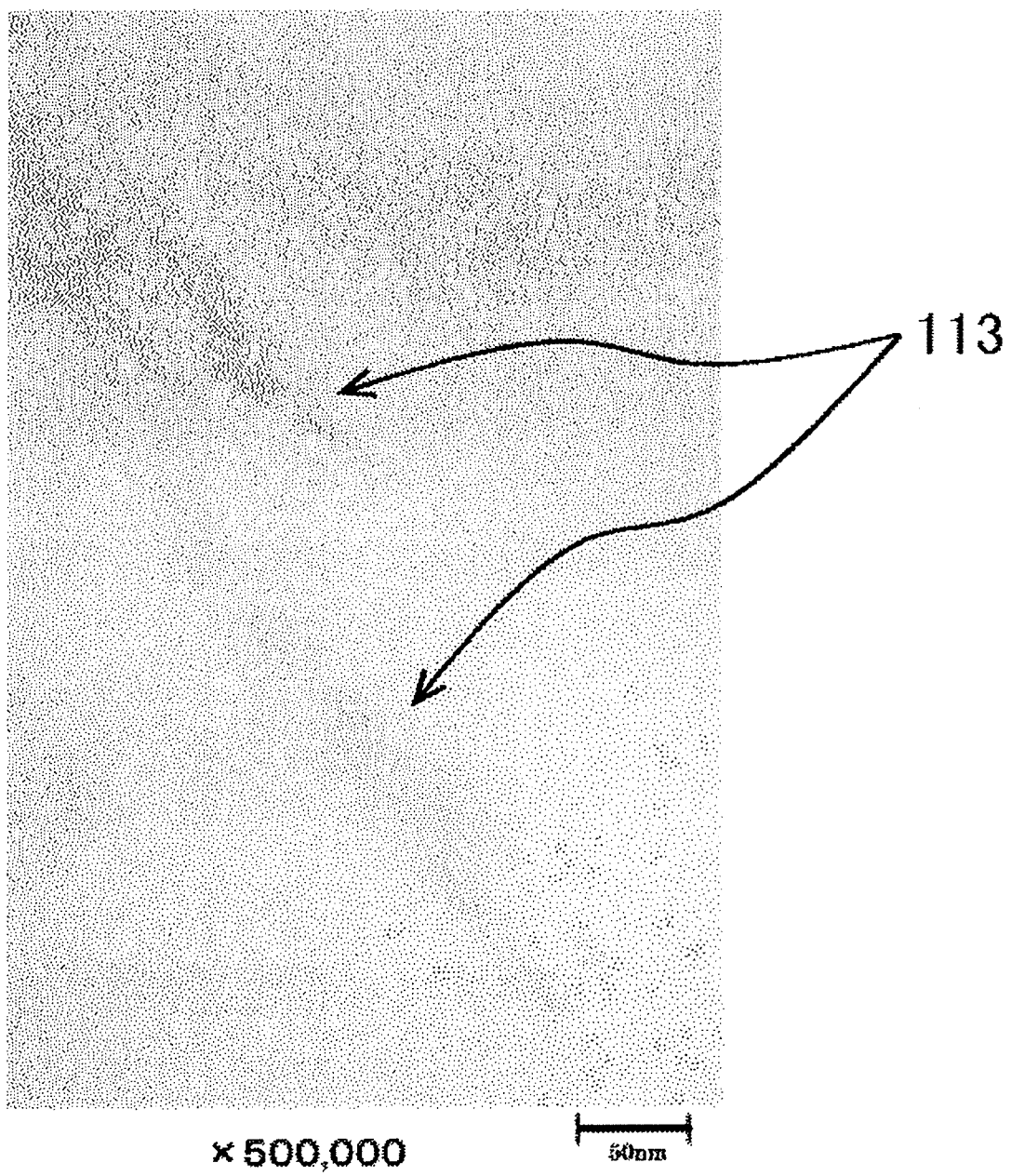
FIG. 11B is a TEM image of Example 11.

FIG. 11B shows a TEM image of a portion in the vicinity of the surface (located at a depth of about 6 μm from the surface) of the organic-inorganic composite material synthesized in Example 11. From the results of the elementary analysis, it was found that lumps 113 (representative lumps are indicated by arrows) which look black in the image comprise the clay. It was found that in the vicinity of the surface of the organic-inorganic composite material, the clay lumps having a short side with a length (the thickness of the clay) of about 50 nm are present.

From FIGS. 11A and 11B, it was found that as for the clay in the organic-inorganic composite material, clay lumps having a short side with a length (the thickness of the clay) of from 50 nm to 10 μm are present together therein.

Production of Example 25

A molding resin raw material was prepared using the organic-inorganic composite material of the invention, and a power semiconductor device was produced. First, to the varnish of Example 11, 80 wt % of silica as a filler, 5 parts by weight of KBM-403 (manufactured by Shin-Etsu Chemical Co., Ltd.) as a silane coupling agent, 2 parts by weight of Hoechst Wax E (manufactured by Clariant Japan Co., Ltd.) as a release agent, and 1 part by weight of carbon black as a coloring agent were added, and the resulting mixture was melt-kneaded, whereby a molding resin raw material was prepared. Separately, a module having a power semiconductor element mounted thereon was produced, and the entire module was coated with the molding resin raw material by a potting method, and the resulting article was heated at 100° C. for 1 hour, at 120° C. for 1 hour, at 150° C. for 1 hour, at 200° C. for 1 hour, and at 250° C. for 6 hours in this order, whereby the resin was thermally cured to complete sealing with the resin.

FIG. 3 shows a schematic view of the thus produced power semiconductor device. A back-side electrode of a power semiconductor element 301 is electrically connected to a circuit wiring member 302 on an insulating substrate 306 through a bonding material 304, and a main electrode of the power semiconductor element 301 is electrically connected to a lead member 303 through a wire 305. On the back side surface of the insulating substrate 306, a radiator plate 307 for radiating heat generated in the power semiconductor element 301 is provided. Then, the circumference of the power semiconductor element 301 is sealed by a molding resin 308 in a state where portions of the circuit wiring member 302, the lead member 303 and the radiator plate 307 are exposed.

As Comparative Example 6, a power semiconductor device sealed by an epoxy resin was produced. The crack growth in the bonding material 304 before and after a temperature cycling test (ΔTc=270° C., −40° C. ↔ 230° C., 1000 times) was observed using an ultrasonic tester. Further, a cycle life determined by a power cycle (PC) test (ΔTc=170° C., 20° C. ↔ 190° C.) was evaluated. The evaluation results are shown in Table 2. In Table 2, α1 represents a coefficient of thermal expansion at a temperature of $T_g$ or lower, and α2 represents a coefficient of thermal expansion at a temperature higher than $T_g$. Further, in Table 2, YDCN-750 represents an o-cresol novolac type epoxy resin and is the trade name given by Tohto Kasei Co., Ltd.

TABLE 2

| | Main agent | Curing agent | Spherical silica filler (wt %) | Tg (° C.) | α1 (ppm/° C.) | α2 (ppm/° C.) | Temperature cycling test (crack growth) | PC test (cycle life) |
|---|---|---|---|---|---|---|---|---|
| Example 25 | Varnish of Example 11 | | 80 | 230 | 16 | 48 | 5% | 10000 times |
| Comparative Example 6 | YDCN | PN | 80 | 155 | 15 | 48 | 40% | 4000 times |

As a result of the evaluation of the cycle life, the power cycle life of Example 25 was 10000 times, however, the power cycle life of Comparative Example 6 was 4000 times. From the above results, it was found that by using the organic-inorganic composite material of the invention in the power semiconductor device, the power cycle life is improved. It is considered that this is because when the organic-inorganic composite material of the invention is used as the sealant, since the composite material has a glass transition temperature of 200° C. or higher, a change in elastic modulus accompanying a change in temperature between 20° C. and 190° C. is small, and stress applied to a soldered portion of the power semiconductor device is decreased.

Production of Example 26 and Comparative Example 7

An electrical wire was coated with the varnish containing the clay and the resin raw material of the invention, followed by heating, whereby an enamel wire was experimentally produced as Example 26. As a result of carrying out an accelerated life test at 150° C., the ratio of decrease in the electrical breakdown voltage after 500 hours to the initial value was 10%.

As Comparative Example 7, an enamel wire was experimentally produced using a commercially available insulating coating material. As a result of carrying out an accelerated life test at 150° C., the ratio of decrease in the electrical breakdown voltage after 500 hours to the initial value was 60%. It is considered that this is because when the organic-inorganic composite material of the invention is used as the coating material for an enamel wire, thermal degradation when the enamel wire is exposed to a high temperature is decreased.

From the above results, it was shown that by using the organic-inorganic composite material of the invention as a coating material for an enamel wire, an enamel wire having excellent thermal stability can be obtained.

Production of Example 27 and Comparative Example 8

An insulating tape was wound around a conductor, followed by heating and drying, and then, the resulting conductor with the insulating tape was vacuum-impregnated with the varnish containing the clay and the resin raw material of the invention. Thereafter, the resulting material was thermally cured, whereby a rotor coil was obtained as Example 27. As a result of carrying out an accelerated life test at 150° C. for the thus obtained rotor coil, the ratio of decrease in the electrical breakdown voltage after 500 hours to the initial value was 20%.

As Comparative Example 8, a rotor coil was produced using a commercially available resin for impregnation. As a result of carrying out an accelerated life test at 150° C., the ratio of decrease in the electrical breakdown voltage after 500 hours to the initial value was 60%. It is considered that this is because when the organic-inorganic composite material of the invention is used as the resin for impregnation, peeling of the resin for impregnation from the conductor of the rotor coil is suppressed in the accelerated life test at 150° C. and partial discharge due to voids such as pores is suppressed.

From the above results, it was shown that by using the organic-inorganic composite material of the invention as a resin for impregnation, a rotor coil having long heat life can be obtained.

What is claimed is:

1. An organic-inorganic composite material, comprising a resin composed of a triazine ring and a thermally cured varnish containing a mixture of a layered clay mineral (clay) subjected to interlayer modification with a metallic complex of amine and a cyanate ester compound,
   wherein the amount of the clay is from 0.1 to 12 wt % of the amount of the cyanate ester compound, and
   the clay in the organic-inorganic composite material is in the form of a flake having a thickness of 0.05 to 10 μm and the length on one side of the flake is from 1 to 50 μm, and
   wherein the organic-inorganic composite material has a thickness of 0.005 to 0.1 mm.

2. The organic-inorganic composite material according to claim 1, wherein the metallic complex of amine includes as a ligand one member selected from the group consisting of an aliphatic amine, a heteroaromatic amine and an aromatic amine.

3. The organic-inorganic composite material according to claim 1, wherein the clay is at least one member selected from the group consisting of a smectite group, a mica group, a vermiculite group and a mica family group.

4. The organic-inorganic composite material according to claim 1, wherein an interlayer distance of the clay is from 1.2 to 2 nm.

5. The organic-inorganic composite material according to claim 1, wherein a transition metal comprising of the metallic complex is at least one element selected from copper, zinc and manganese.

6. The organic-inorganic composite material according to claim 5, wherein the amount of the transition metallic complex is from 0.1 to 30 wt % of the amount of the clay.

7. The organic-inorganic composite material according to claim 5, wherein the amount of the transition metal element is from 0.01 to 10 wt % of the amount of the organic-inorganic composite material.

8. The organic-inorganic composite material according to claim 1, wherein the organic-inorganic composite material has a glass transition temperature of 200° C. or higher, an adhesive strength of 0.5 kN/m or more and an electrical breakdown strength of 150 kV/mm or more.

9. An electrical device, comprising an organic-inorganic composite material, which is in contact with a metal and includes a resin composed of a triazine ring and a thermally cured varnish containing a mixture of a layered clay mineral (clay) subjected to interlayer modification with a metallic complex of amine and a cyanate ester compound,
   wherein the amount of the clay is from 0.1 to 12 wt % of the amount of the cyanate ester compound, and the clay in the organic-inorganic composite material is in the form of a flake having a thickness of 0.05 to 10 μm and the length on one side of the flake is from 1 to 50 μm, and
   wherein the organic-inorganic composite material has a thickness of 0.005 to 0.1 mm.

10. A semiconductor device, which has a structure in which the circumference of a semiconductor element is sealed by a sealant, wherein as the sealant, the organic-inorganic composite material according to claim 1 is used.

11. A varnish, comprising a mixture of a layered clay mineral (clay) subjected to interlayer modification with a metallic complex of amine and a cyanate ester compound, wherein the amount of the clay is from 0.1 to 12 wt % of the amount of the cyanate ester compound, and the clay is in the form of a flake having a thickness of 0.05 to 10 μm and the length on one side of the flake is from 1 to 50 μm,
   wherein the varnish is used in the organic-inorganic composite material according to claim 1, and said thickness of the clay is measured in the organic-inorganic composite material.

12. The varnish according to claim 11, wherein the cyanate ester compound is 4,4'-ethylidenediphenyldicyanate, the clay is montmorillonite, and in an interlayer space of the montmorillonite, a metallic complex containing 1,3-propanediamine as a ligand is intercalated.

13. An electrical wire, which is obtained by coating the circumference of a conductor with an insulating material, wherein as the insulating material, the organic-inorganic composite material according to claim 1 is used.

14. A rotor coil, which is obtained by impregnating a conductor with an insulating material wound therearound with a resin, wherein as the resin used in the impregnation, the organic-inorganic composite material according to claim 1 is used.

\* \* \* \* \*